United States Patent
Juengling

(10) Patent No.: US 6,593,203 B2
(45) Date of Patent: *Jul. 15, 2003

(54) SEMICONDUCTOR PROCESSING METHODS OF FORMING A PLURALITY OF CAPACITORS ON A SUBSTRATE, BIT LINE CONTACTS AND METHOD OF FORMING BIT LINE CONTACTS

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/121,538

(22) Filed: Apr. 10, 2002

(65) Prior Publication Data

US 2002/0115261 A1 Aug. 22, 2002

Related U.S. Application Data

(60) Continuation of application No. 09/651,816, filed on Aug. 30, 2000, now Pat. No. 6,395,613, which is a continuation-in-part of application No. 09/036,701, filed on Mar. 6, 1998, now abandoned, which is a division of application No. 08/742,895, filed on Nov. 1, 1996, now Pat. No. 5,998,256.

(51) Int. Cl.⁷ .............................................. H01L 21/20
(52) U.S. Cl. .................................................... 438/396
(58) Field of Search ........................ 438/396, 253–256, 438/397, 398, 399

(56) References Cited

U.S. PATENT DOCUMENTS

| 4,999,689 | A | | 3/1991 | Iguchi et al. ............... 357/23.6 |
| 5,250,457 | A | | 10/1993 | Dennison ..................... 437/48 |
| 5,496,757 | A | | 3/1996 | Rosner ........................ 437/52 |
| 5,554,557 | A | | 9/1996 | Koh ............................ 437/52 |
| 5,702,972 | A | | 12/1997 | Tsai et al. ...................... 437/56 |
| 5,702,990 | A | | 12/1997 | Jost et al. ..................... 438/618 |
| 5,792,687 | A | | 8/1998 | Jeng et al. ................... 438/253 |
| 5,998,256 | A | | 12/1999 | Juengling ..................... 438/253 |
| 6,160,283 | A | * | 12/2000 | Clampitt et al. ............. 257/304 |
| 6,175,146 | B1 | * | 1/2001 | Lane et al. .................. 257/635 |
| 6,194,302 | B1 | | 2/2001 | Shen .......................... 438/597 |
| 6,395,613 | B1 | * | 5/2002 | Juengling .................... 438/396 |

* cited by examiner

Primary Examiner—David Nelms
Assistant Examiner—Quoc Hoang
(74) Attorney, Agent, or Firm—Wells St. John P.S.

(57) ABSTRACT

Semiconductor processing methods include forming a plurality of patterned device outlines over a semiconductor substrate, forming electrically insulative partitions or spacers on at least a portion of the patterned device outlines, and forming a plurality of substantially identically shaped devices relative to the patterned device outlines. Individual formed devices are spaced from at least one other of the devices by a distance no more than a width of one of the electrically insulative spacers. In such manner, device pitch is reduced by almost fifty percent. According to one aspect, capacitors are formed which, according to a one embodiment, form part of a dynamic random access memory (DRAM) array.

32 Claims, 12 Drawing Sheets

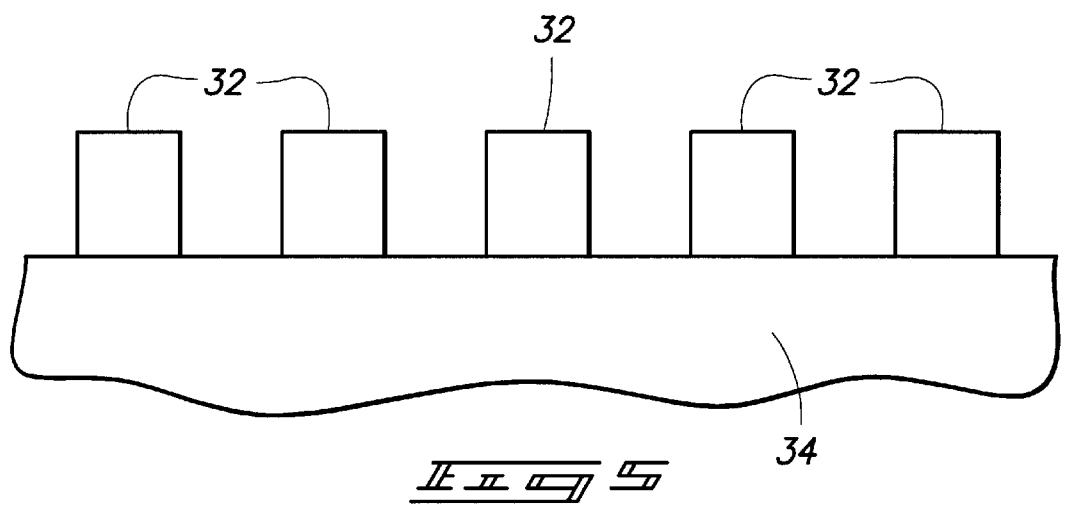
_FIG 5_
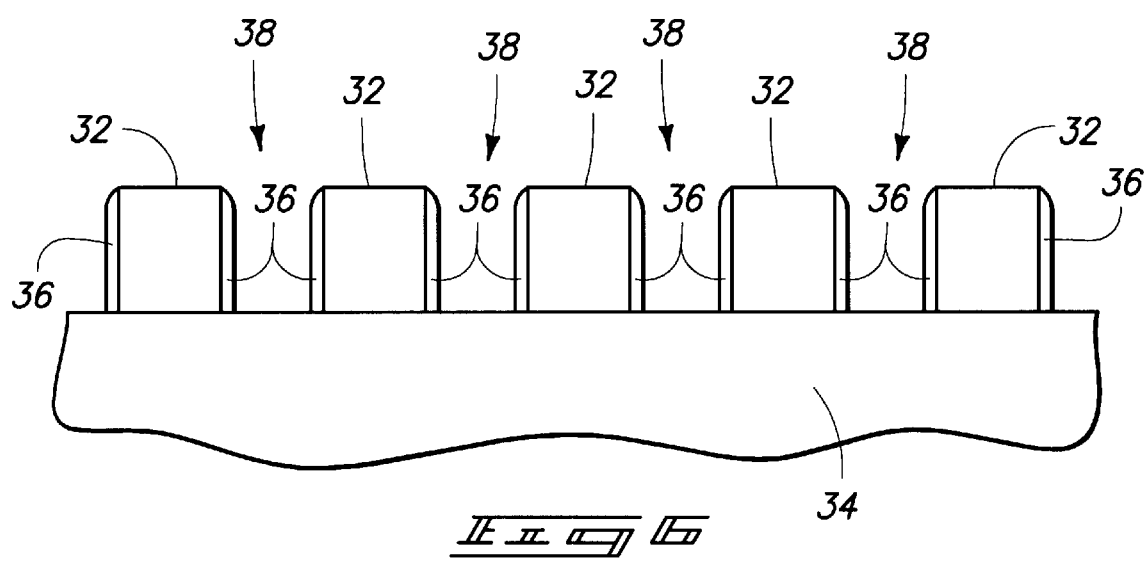
_FIG 6_

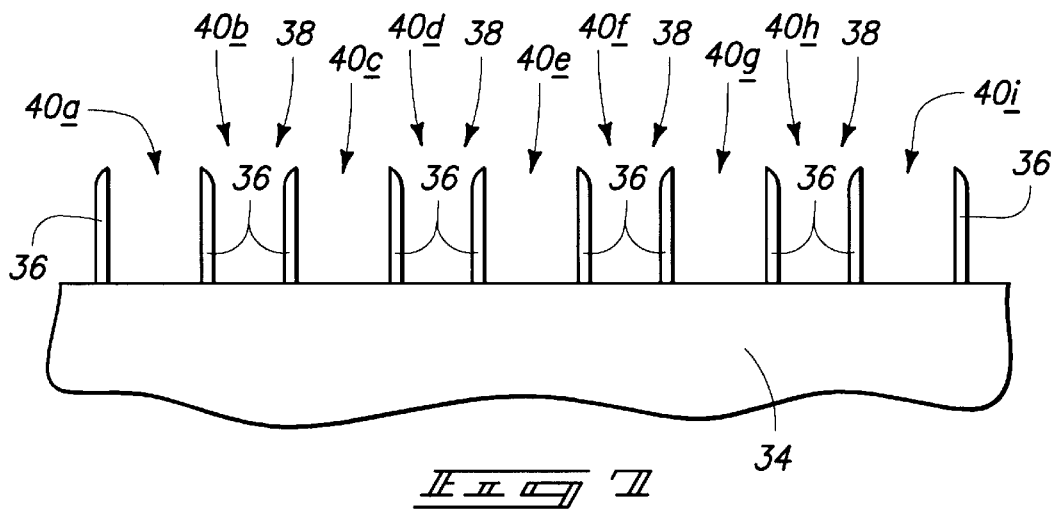
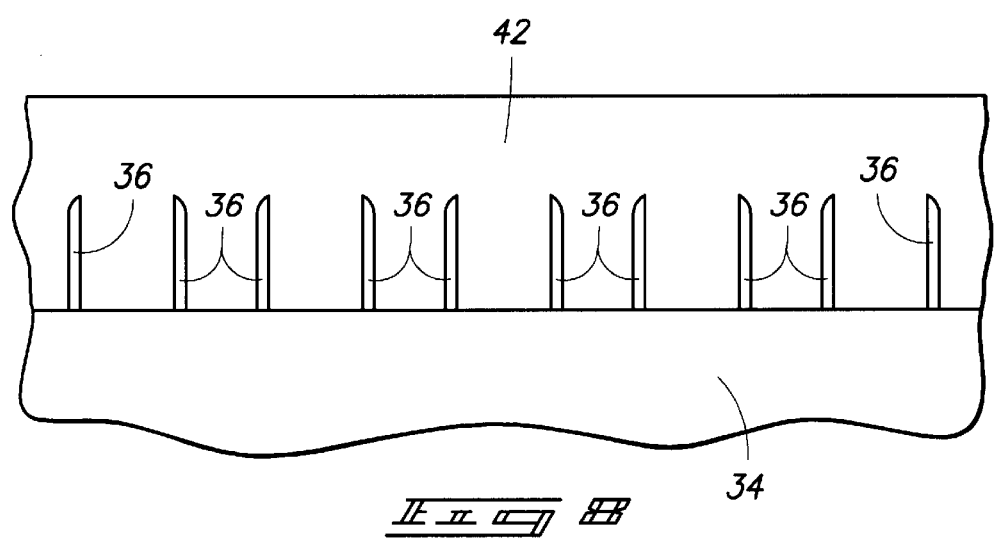

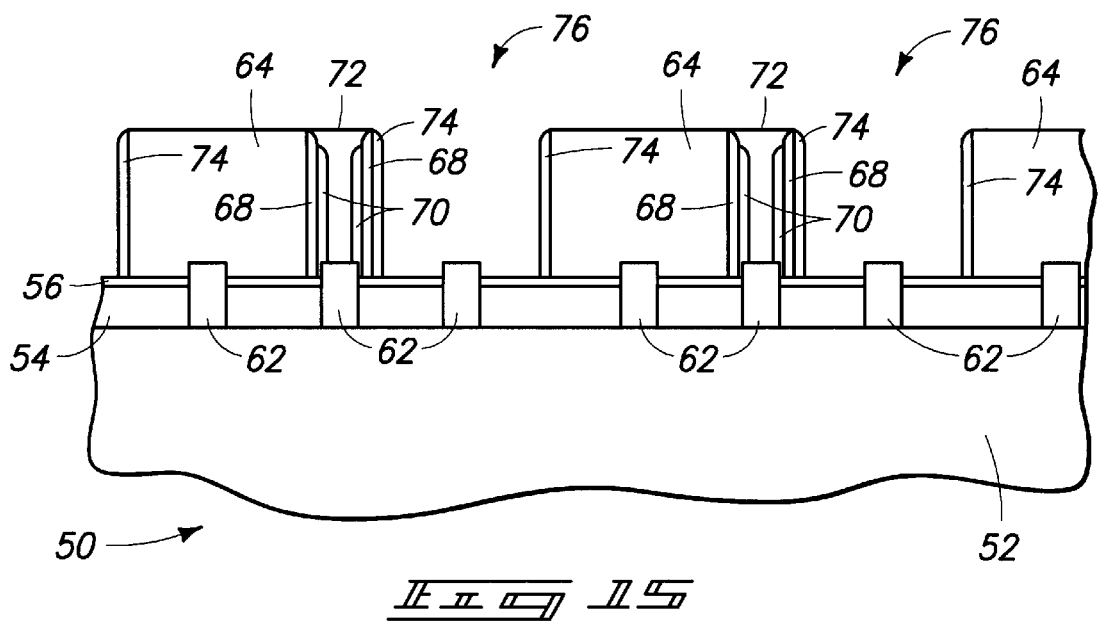
$\mathbb{F}\mathbb{T}\mathbb{G}\ 15$
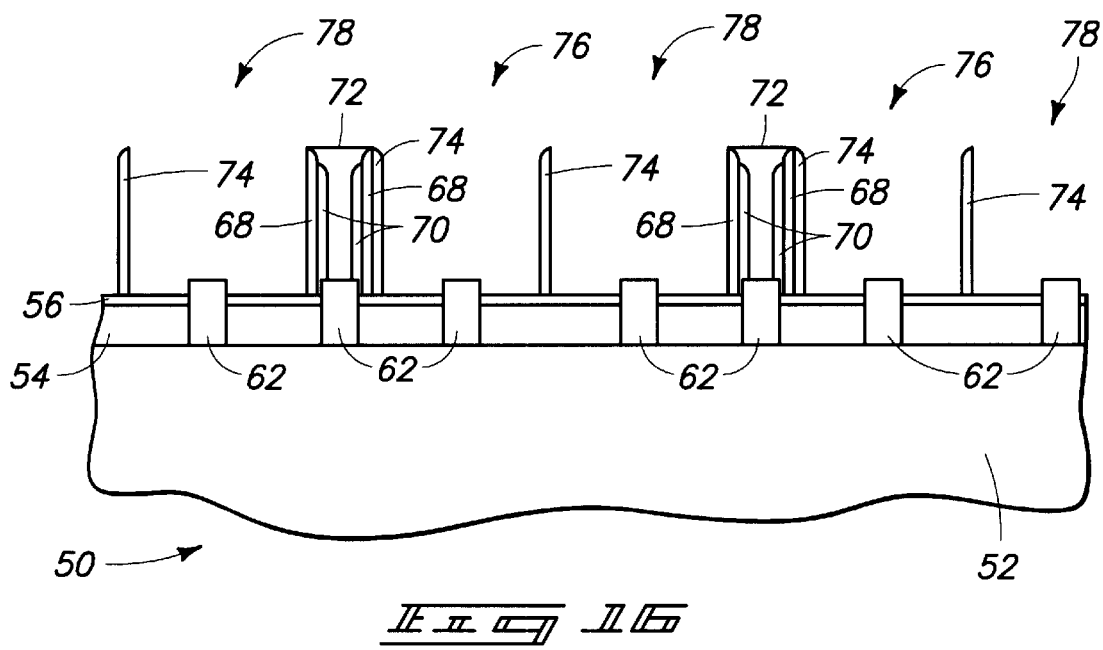
$\mathbb{F}\mathbb{T}\mathbb{G}\ 16$

SEMICONDUCTOR PROCESSING METHODS OF FORMING A PLURALITY OF CAPACITORS ON A SUBSTRATE, BIT LINE CONTACTS AND METHOD OF FORMING BIT LINE CONTACTS

CROSS REFERENCE TO RELATED APPLICATION

This patent application is a continuation application of U.S. patent application Ser. No. 09/651,816, filed on Aug. 30, 2000, now U.S. Pat. No. 6,395,613 B1, entitled "Semiconductor Processing Methods of Forming a Plurality of Capacitors on a Substrate, Bit Line Contacts and Method of Forming Bit Line Contacts", naming Werner Juengling as inventor, which is a continuation-in-part application of U.S. patent application Ser. No. 09/036,701, filed on Mar. 6, 1998, now abandoned entitled "Semiconductor Processing Methods Of Forming Devices On A Substrate, Forming Device Arrays On A Substrate, Forming Conductive Lines On A Substrate, And Forming Capacitor Arrays On A Substrate, And Integrated Circuitry", naming Werner Juengling as inventor, which is a divisional application of U.S. patent application Ser. No. 08/742,895, filed on Nov. 1, 1996, having the same title and inventor and which is now U.S. Pat. No. 5,998,256, the disclosure of which is incorporated by reference.

TECHNICAL FIELD

This invention relates to semiconductor processing methods of forming a plurality of capacitors on a substrate, bit line contacts and method of forming bit line contacts.

BACKGROUND OF THE INVENTION

Circuit devices fabricated on or over semiconductor wafers typically undergo one or more photolithographic steps during formation. During such photolithographic steps, device features can be etched using conventional techniques. The spacing between such devices is important because often times adjacent devices must be electrically isolated from one another to avoid unwanted electrical interconnections.

One of the limitations on device spacing stems from limitations inherent in the photolithographic process itself. In the prior art, devices are generally spaced only as close as the photolithographic limit will permit.

By way of example and referring to FIGS. 1 and 2, a semiconductor wafer fragment 25 includes a substrate 29 atop which a material 28 is provided. A plurality of patterned masking layers 26 are formed atop the material 28.

Referring to FIG. 3, the material 28 is anisotropically etched through the patterned masking layers 26 to form lines 30 atop the substrate 29. As shown, individual lines 30 have respective widths $L_1$ which constitute the minimum photolithographic feature size available for a line. Typically, a separation $S_1$ separates adjacent lines 30 across the substrate as shown. Such dimension is typically only slightly larger than $L_1$ but could be the same as $L_1$. The term "pitch" as used herein is intended to be in its conventional usage, and is defined as the distance between one edge of a device and the corresponding same edge of the next adjacent device. Accordingly and in the illustrated example, the pitch $P_1$ between adjacent lines 30 (i.e., from the left illustrated edge of one line 30 to the left illustrated edge of the next immediately adjacent line 30) is equal to the sum of $L_1$ and $S_1$.

As integrated circuitry gets smaller and denser, the need to reduce spacing dimensions or pitch, such as $S_1$ and $P_1$, becomes increasingly important. This invention grew out of the need to reduce the size of integrated circuits, and particularly the need to reduce spacing dimensions and pitches between adjacent devices over a semiconductor wafer.

SUMMARY OF THE INVENTION

The invention includes semiconductor processing methods and related integrated circuitry in which a plurality of patterned device outlines are formed over a semiconductor substrate. Electrically insulative partitions or spacers are then formed on at least a portion of the patterned device outlines, after which a plurality of substantially identically shaped devices are formed relative to the patterned device outlines. Individual formed devices are spaced from at least one other of the devices by a distance substantially no more than a width of one of the electrically insulative spacers.

According to one aspect of the invention, capacitors are formed. In one embodiment, a pair of adjacent capacitor containers are formed over a substrate by etching a first capacitor container opening having at least one sidewall. An electrically insulative spacer is formed over the sidewall. A second capacitor container opening is etched selectively relative to the spacer. Capacitors are then formed in the capacitor containers in a manner such that adjacent capacitors have a separation distance which is substantially no greater than the width of the spacer between the adjacent capacitors.

In one aspect, a bit line contact is formed. The bit line contact is formed as an opening that extends through a layer formed on a substrate to a node on the substrate. A first dielectric sidewall is formed in the opening and coats an interior sidewall of the opening. A second dielectric sidewall is formed in the opening and coats an interior sidewall of the first dielectric layer. A conductive plug is formed within an interior sidewall of the second dielectric layer and extends through the opening to establish electrical communication to the node.

A novel masking layout is provided which allows capacitors to be formed in a manner which reduces device pitch by almost 50%. Such is particularly adaptive for use in fabrication of DRAM circuitry.

BRIEF DESCRIPTION OF THE DRAWINGS

Embodiments of the invention are described below with reference to the following accompanying drawings.

FIG. 5 is a side view of the FIG. 4 semiconductor wafer fragment.

FIG. 6 is a view of the FIG. 5 semiconductor wafer fragment at a processing step subsequent to that shown by FIG. 5.

FIG. 7 is a view of the FIG. 5 semiconductor wafer fragment at a processing step subsequent to that shown by FIG. 6.

FIG. 8 is a view of the FIG. 5 semiconductor wafer fragment at a processing step subsequent to that shown by FIG. 7.

FIG. 15 is a view of the FIG. 11 semiconductor wafer fragment at a processing step subsequent to that shown by FIG. 14.

FIG. 16 is a view of the FIG. 11 semiconductor wafer fragment at a processing step subsequent to that shown by FIG. 15.

DETAILED DESCRIPTION OF THE PREFERRED EMBODIMENTS

This disclosure of the invention is submitted in furtherance of the constitutional purposes of the U.S. Patent Laws "to promote the Progress of Science and useful Arts" (Article 1, Section 8).

Figure 1:
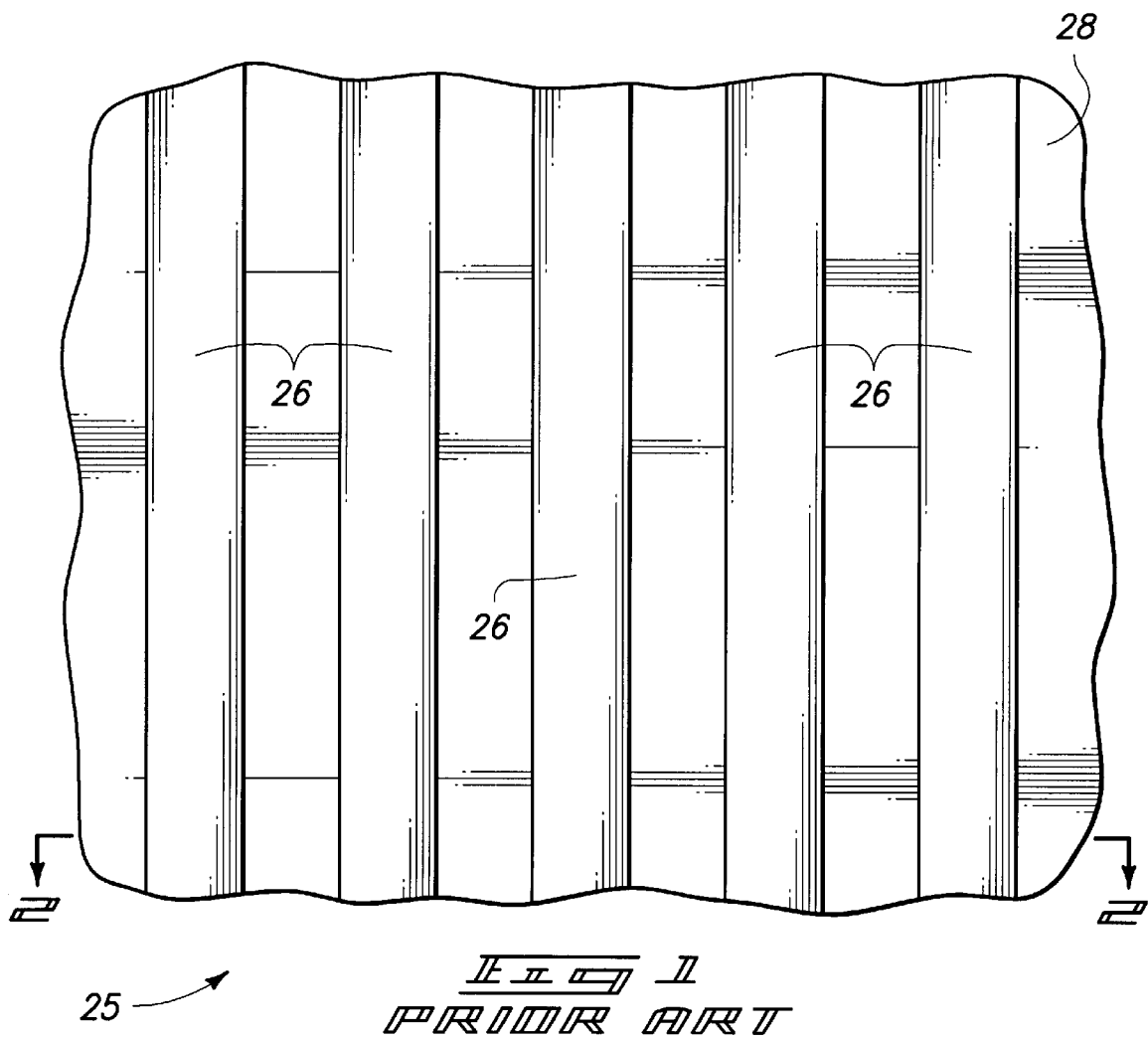
FIG. 1 is a top plan view of a prior art semiconductor wafer fragment atop which a plurality of masking layers are formed, and is discussed in the "Background" section above.
Figure 2:
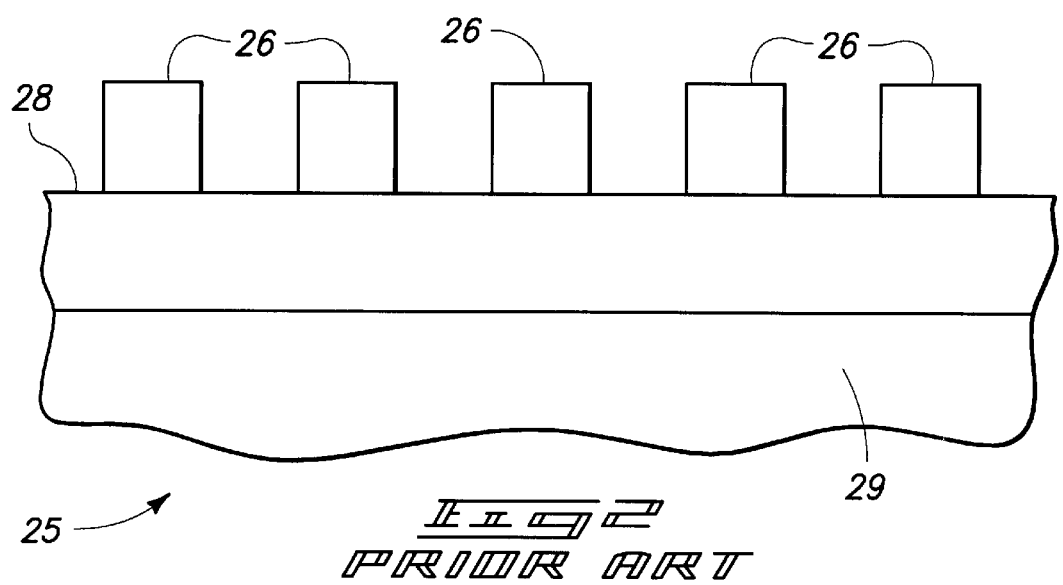
FIG. 2 is a side sectional view of the FIG. 1 prior art semiconductor wafer taken along line 2—2 in FIG. 1.
Figure 3:
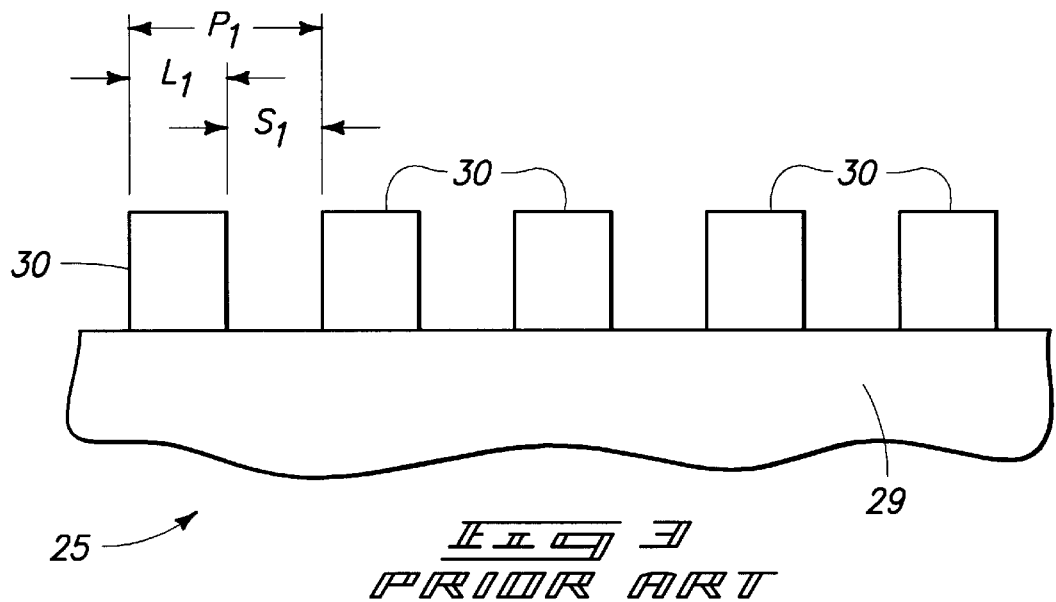
FIG. 3 is a view of the FIG. 1 prior art semiconductor wafer fragment at a processing step subsequent to that shown in FIG. 1.
Figure 4:
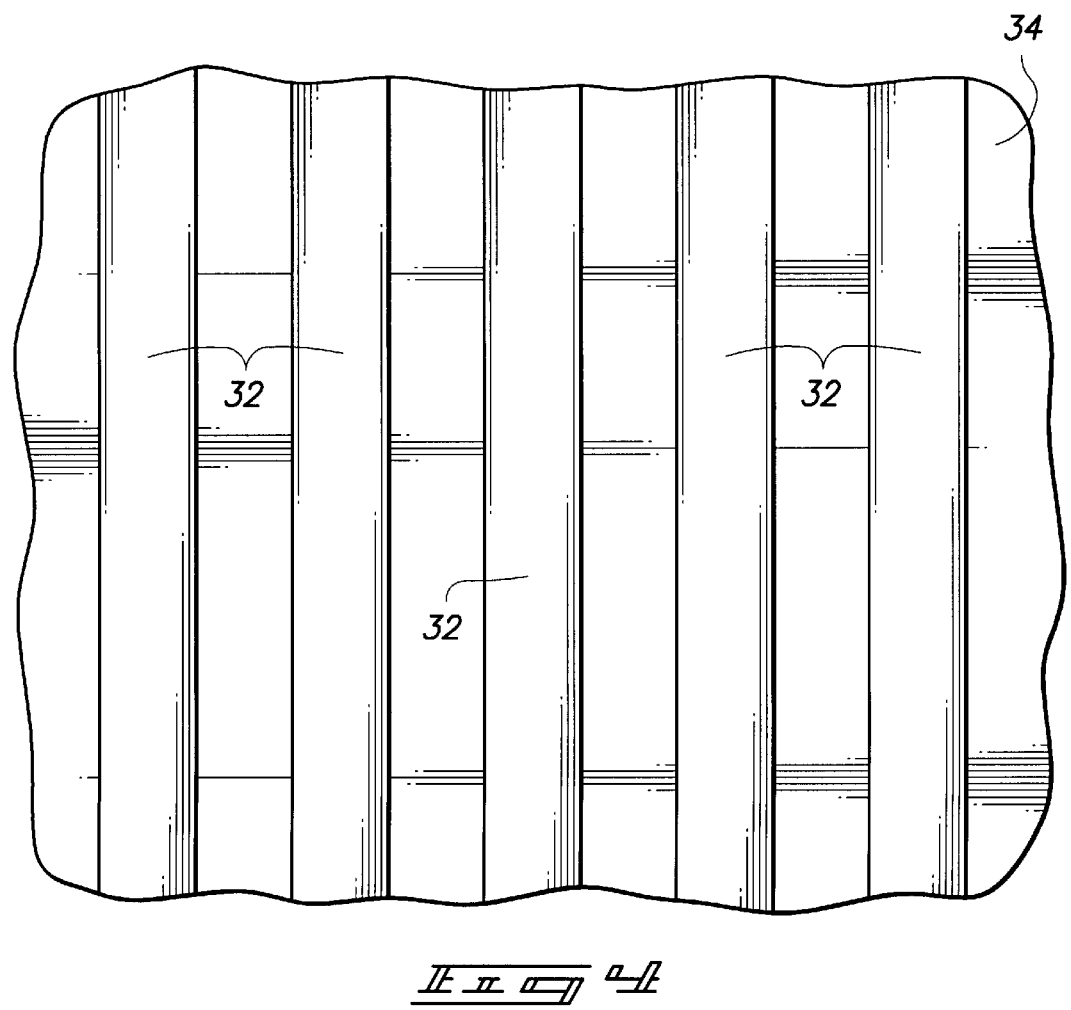
FIG. 4 is a top plan view of a semiconductor wafer fragment atop which a plurality of masking layers are formed at one processing step in accordance with one aspect of the invention.

Referring initially to FIGS. 4 and 5, a plurality of patterned device outlines 32 are photolithographically formed over a semiconductive substrate 34. As used herein, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In this illustrated example, the material constituting outlines 32 may be of the type which can be etched selectively relative to the substrate 34. Such outlines define areas over the substrate 34 in which conductive lines are to be formed. Such patterned device outlines are, dimension-wise, substantially the same as those set forth with regard to the patterned masking layers 26 illustrated in FIGS. 1–3.

Referring to FIG. 6, an electrically insulative material such as $SiO_2$ or $Si_3N_4$ is formed over the lines 32 and the substrate 34 and is subsequently anisotropically etched to provide a plurality of sidewall spacers 36 on at least a portion, and possibly all, of the pattern device outlines 32. For purposes of the ongoing discussion, the patterned device outlines 32 define male patterns between which female patterns 38 are also formed. Accordingly, an array of alternating male/female patterns are formed over the substrate wherein the sidewall spacers 36 are formed in the female patterns 38.

Referring to FIG. 7, and after forming the sidewall spacers 36, the male patterns or patterned device outlines 32 are removed by suitable etching techniques. The etch etches the device outlines 32 relative to the material forming spacers 36 and the substrate 34. Such leaves behind a plurality of upstanding sidewall spacers 36 which effectively define thin electrically insulative partitions between which a plurality of devices are to be formed. As shown, the distance or lateral spacing between adjacent spacers varies from spacer-to-spacer. According to one aspect, a plurality of spaces 40a through 40i are provided wherein adjacent spaces, such as 40a and 40b, differ slightly in lateral width dimension, while alternate spaces, such as 40a and 40c, have substantially the same lateral width dimension.

Referring to FIG. 8, a conductive material 42 is formed over the substrate 34 and the sidewall spacers 36 and may completely fill the spaces 40a through 40i. An example material for the layer 32 is conductively doped polysilicon.

Figures 9, 10:
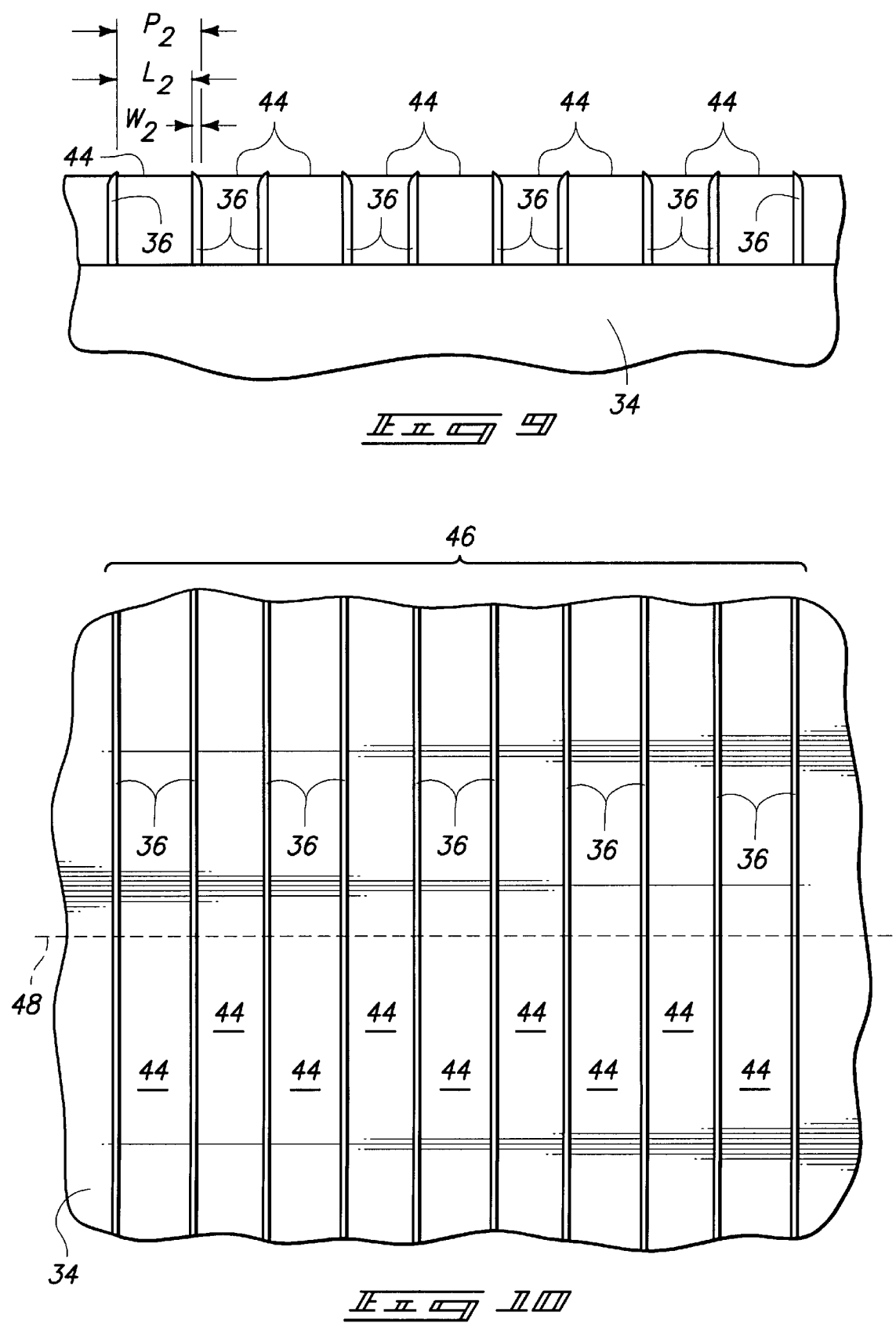
FIG. 9 is a view of the FIG. 5 semiconductor wafer fragment at a processing step subsequent to that shown by FIG. 8.
FIG. 10 is a top plan view of the FIG. 9 semiconductor wafer fragment.

Referring to FIG. 9, the conductive material 42 is etched back by suitable methods such as a chemical-mechanical polish (CMP) or dry etching, as is known in the art. Such forms a plurality of substantially identically shaped circuit devices relative to the patterned device outlines 32 (FIG. 6). In this embodiment, such devices are conductive lines 44 which are spaced laterally from one another a distance which is no greater than a width of one of the electrically insulative sidewall spacers 36 therebetween. As so formed, immediately adjacent conductive lines of the plurality of lines formed have a pitch $P_2$ which is substantially no greater than a lateral line width $L_2$ plus a width $W_2$ of the spacer 36 which is positioned between the adjacent lines. As compared to the pitch $P_1$ (FIG. 3) of the prior circuit devices, pitch $P_2$ represents a reduction in pitch which approaches fifty percent. Such achieved pitch reductions are without regard to the prior art photolithographic spacing constraints imposed on semiconductor processing. As mentioned above, the spacing between adjacent spacers 36 varies from one spacer 36 to another spacer 36. Accordingly, the pitch $P_2$ varies as well. It is possible for the spacing between adjacent spacers 36 to be uniform, however, so that the pitch remains constant across the substrate 34.

Referring to FIG. 10, a top plan view of the substrate 34 is shown. Conductive lines 44 collectively define a series of conductive lines which in turn define a device array 46 of substantially identically shaped devices. The array 46 includes the plurality of upstanding spacers 36 and the conductive lines 44 formed intermediate the spacers 36. In accordance with one aspect of the invention and as described with reference to FIG. 9 above, adjacent lines 44 have a pitch which is substantially no greater than about the distance between a pair of adjacent spacers 36 (corresponding to the line width) plus the width of the spacer 36 therebetween. In the illustrated example, conductive lines 44 are elongated and adjacent conductive lines 44 have different lateral line widths. Additionally, alternate lines 44 have substantially equal lateral line widths. Such variation in line width stems from the manner in which the anisotropically etched sidewall spacers 36 are provided over the substrate 34, and in particular the lateral spacing of device outlines 32 (FIG. 5). As mentioned above, it is possible for the line widths to be substantially equal over the entire substrate 34.

Referring still to FIG. 10, a dashed line 48 traverses the device array 46. Individual elongated conductive lines 44 are formed over the substrate 34 transversely along the line 48. Respective alternate devices along the line 48 have a substantially common width dimension therealong and respective adjacent devices have a different width dimension therealong.

Referring collectively to FIGS. 11–18, a semiconductor processing method of forming a plurality of alternate devices on a substrate in accordance with the above-described principles is described. According to one aspect of the invention, the devices comprise capacitors, and may comprise capacitors forming part of a dynamic random access memory (DRAM) device. Circuit devices other than the illustrated and described conductive lines and capacitors can be fabricated in accordance with the invention.

In accordance with one embodiment, a plurality of bit line contacts are formed in openings etched over a substrate in one etching step, and a plurality of capacitor container openings are etched over the substrate in another two separate etching steps. Thereafter, corresponding DRAM capacitors are formed within the container openings according to known processing techniques. As so formed, and in accordance with the above-described spacer formation and pitch reduction concepts, a plurality of pairs of adjacent capacitors are formed in respective adjacent capacitor containers which are separated by no more than anisotropically etched, electrically insulative sidewall spacers as will become evident below.

Figure 11:
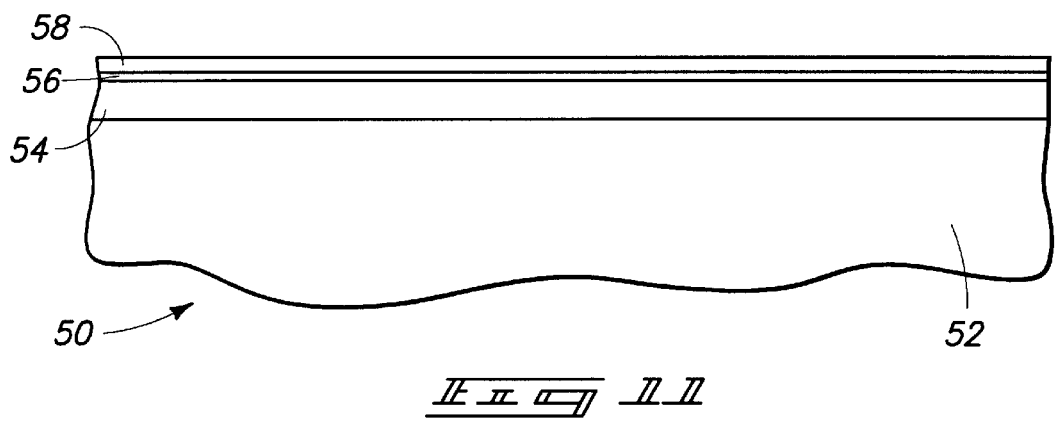
FIG. 11 is a view of a semiconductor wafer fragment at one processing step in accordance with another aspect of the invention.

Referring specifically to FIG. 11, a semiconductor wafer fragment in process is shown generally at 50 and includes a layer of material 52 which may or not may be semiconductive. Transistors forming part of the DRAM circuitry array are not shown, but may be formed elevationally below the capacitors described hereafter, and contacts to these underlying structures may be formed, for example, using polysilicon plugs. Other elevational configurations as between transistors and capacitors are possible. A layer 54 is formed over the material 52. In one embodiment, the layer 54 is formed from borophosphosilicate glass (BPSG) to a thickness around two microns. A layer 56 is then formed on the layer 54. In one embodiment, the layer 56 is formed from silicon nitride to have a thickness of between 200 and 400 angstroms. In one embodiment, the layer 56 is formed by plasma-enhanced chemical vapor deposition. In one embodiment, the layer 56 is formed from tantalum pentoxide. A layer 58 is then formed on the layer 56. In one embodiment, the layer 58 is formed from BPSG or from TEOS-deposited silicon dioxide. In one embodiment, the layer 58 is formed to have a thickness of between 300 and 600 Angstroms. In one embodiment, the layer 56 is formed from a material providing chemical selectivity relative to the layers 54 and 58 and thus may function as an etch stop.

Figure 12:
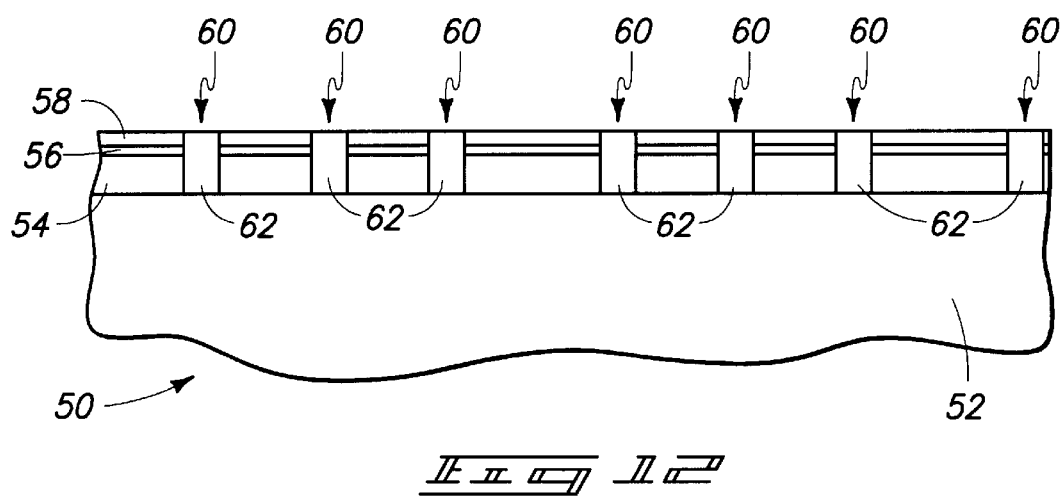
FIG. 12 is a view of the FIG. 11 semiconductor wafer fragment at a processing step subsequent to that shown by FIG. 11.

Referring to FIG. 12, the layers 54, 56 and 58 are anisotropically etched to form bit line contact and capacitor contact openings 60 through the layers 54, 56 and 58.

Thereafter, contact material 62 is formed over the substrate and into the openings 60. In one embodiment, the contact material 62 is conductively doped polysilicon. Such contact material 62 is or may be planarized by suitable chemical-mechanical polishing or plasma etching to provide the illustrated contacts or plugs 62. The plugs 62 are in electrical communication with circuit nodes, such as transistors, that were previously formed according to known principles. The layer 58 is chosen to have a thickness sufficient that if the surfaces of the plugs 62 are eroded by the planarization process, the plugs 62 together with the layer 56 still form a continuous chemical barrier to prevent etching of the layer 54 during subsequent processing steps.

Figure 13:
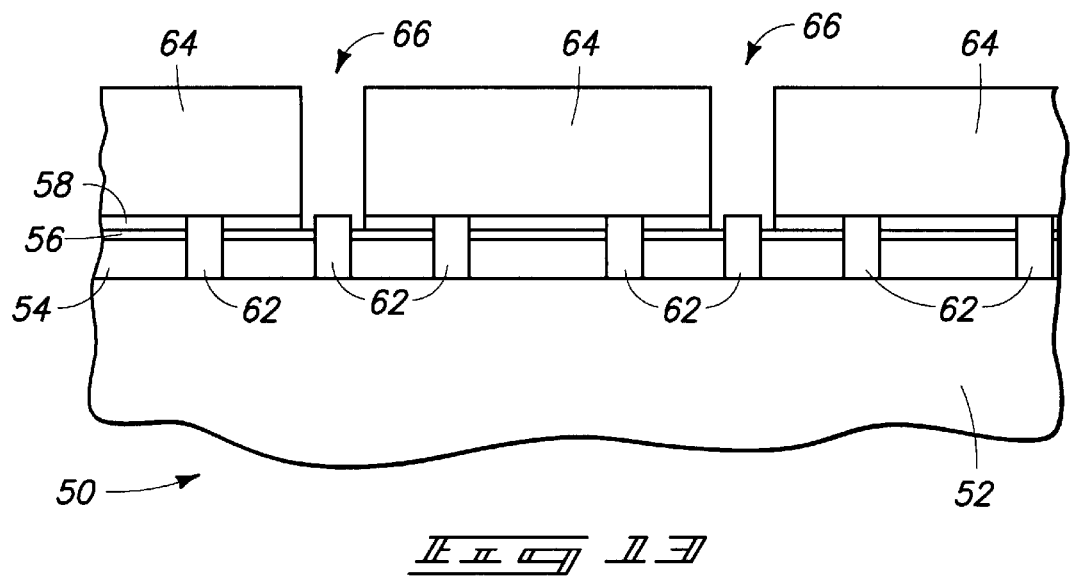
FIG. 13 is a view of the FIG. 11 semiconductor wafer fragment at a processing step subsequent to that shown by FIG. 12.

Referring to FIG. 13, a thick layer 64 is then formed over the contacts 62 and the layer 58. In one embodiment, the layer 64 is formed from BPSG. In one embodiment, the layer 64 is formed to have a thickness of 1.5 microns, however, other thicknesses are possible. A photoresist pattern corresponding to bit line contact openings 66 is formed on the layer 64. The bit line contact openings 66 are anisotropically etched through the layers 64 and 58 and may or may not continue through the layer 56. In one embodiment, the bit line contact openings 66 have a width of between 0.16 and 0.26 microns.

Figure 14:
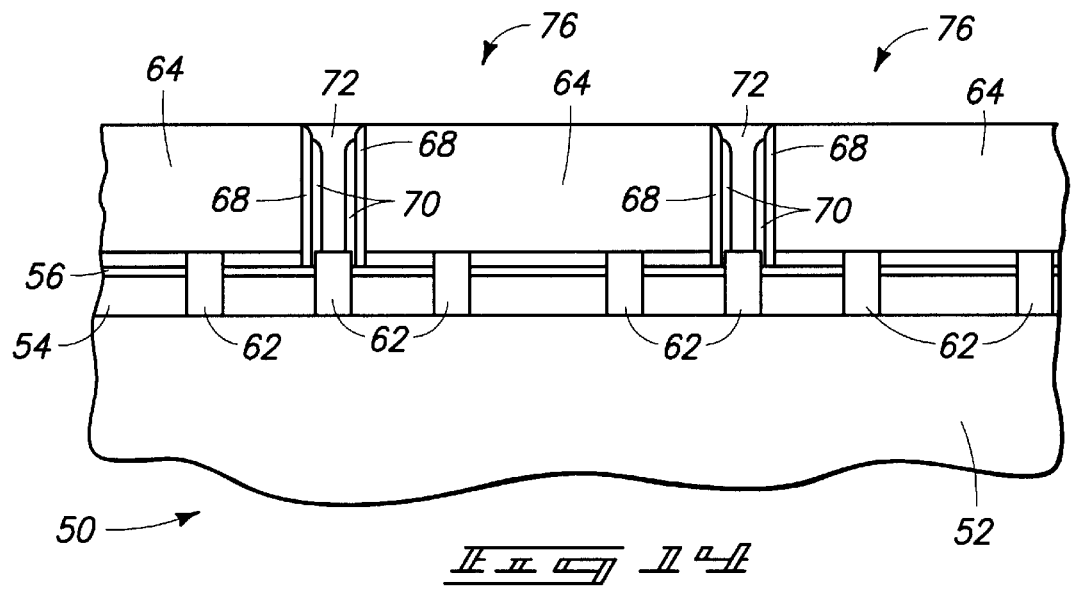
FIG. 14 is a view of the FIG. 11 semiconductor wafer fragment at a processing step subsequent to that shown by FIG. 13.

Referring to FIG. 14, sidewall spacers 68 are formed in the bit line contact openings 66. In one embodiment, the sidewall spacers 68 are formed by depositing a layer of silicon nitride 200 Angstroms thick and then anisotropically etching the silicon nitride layer to remove portions of the layer formed on the contacts 62 and on other horizontal features. In one embodiment, second sidewall spacers 70 are then formed within the sidewall spacers 68. In one embodiment, the second sidewall spacers 70 are formed by depositing up to 600 Angstroms of silicon dioxide. The silicon dioxide is then anisotropically etched to remove the silicon dioxide from the contacts 62 and other horizontal features.

Bit line contacts 72 are then formed in openings 66. In one embodiment, the bit line contacts 72 are formed by depositing conductive polysilicon followed by planarization, such as chemical-mechanical polishing or plasma etching.

The sidewall spacers 68 and 70 collectively act to reduce capacitance from the bit line contact 72 to neighboring capacitors to be formed in subsequent steps. The second sidewall spacers 70 may be formed from silicon dioxide and to have a greater thickness than the first sidewall spacers 68 in order to reduce capacitance, due to the reduced relative dielectric constant of silicon dioxide relative to that of silicon nitride. The first sidewall spacers 68 and the bit line contact 72 seal the second sidewall spacers 70 and prevent the second sidewall spacers from being etched during subsequent processing steps.

Referring to FIG. 15, first capacitor containers 76 are then formed. A photoresist layer 88 (FIG. 19) is formed to define openings corresponding to the first capacitor containers 76 and an anisotropic etch is used to etch through the layers 64 and 58, stopping at the contacts 62 and the layer 56. The photoresist layer 88 is then stripped and sidewall spacers 74 are formed. In one embodiment, the sidewall spacers 74 are formed by depositing a 300 Angstrom thick layer of silicon nitride and then anisotropically etching the silicon nitride to remove it from the contacts 62 and other horizontal surfaces.

A thin photoresist layer is then applied and is exposed to remove the photoresist from the layer 64 and the bit line contacts 72 but not from bottoms of the first capacitor containers 76. A wet etching process such as a hydrofluoric acid etch may then be used to remove exposed portions of the layer 64 and form second capacitor containers 78, as shown in FIG. 16.

Individual containers of a pair of capacitor containers 76 and 78 are separated from each other by no more than the width of a non-conducting partition 74. As discussed above with reference to the pitch advantages achieved with conductive lines 44 (FIGS. 9 and 10), such advantages are achieved through the use of spacers or partitions 74 which electrically isolate adjacent capacitors formed in respective capacitor containers 76 and 78.

Figure 17:
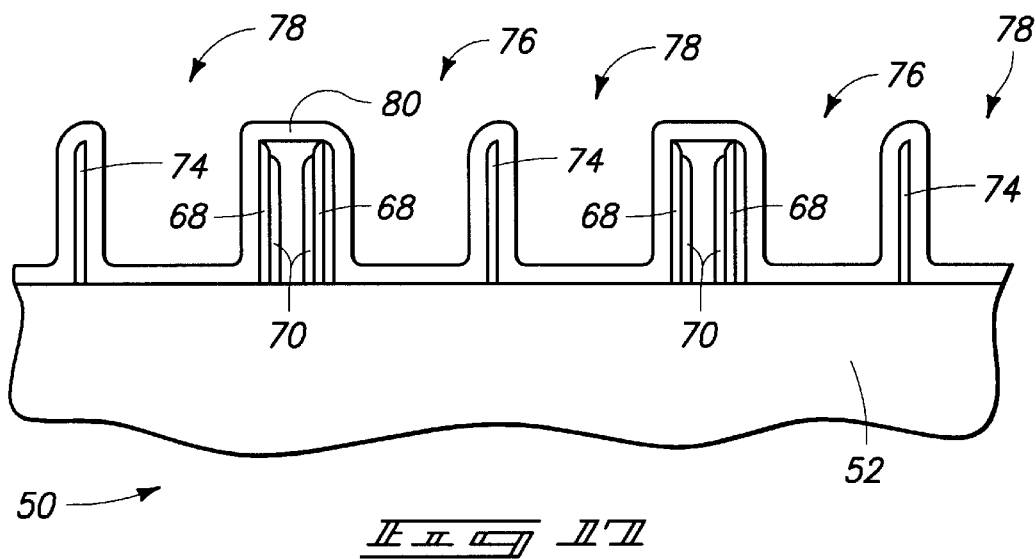
FIG. 17 is a view of the FIG. 11 semiconductor wafer fragment at a processing step subsequent to that shown by FIG. 16.
Figure 18:
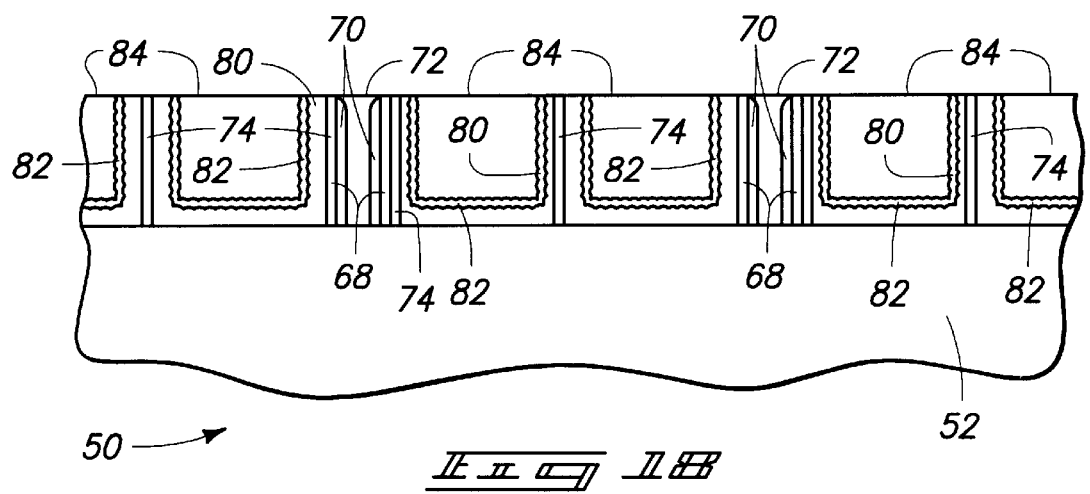
FIG. 18 is a view of the FIG. 11 semiconductor wafer fragment at a processing step subsequent to that shown by FIG. 17.

Referring to FIGS. 17 and 18, electrically conductive container material 80 is formed over the substrate and planarized (FIG. 18) to define a plurality of capacitor storage nodes in selected container shapes. In one embodiment, the electrically conductive container material 80 is conductive polysilicon. In one embodiment, the electrically conductive container material 80 is hemispherical grain polysilicon. In one embodiment, the hemispherical grain polysilicon provides an HSG factor of about 1.8, that is, provides an increase in surface area of 1.8 relative to that of a comparable flat polysilicon layer.

Subsequently, capacitors are formed according to conventional formation techniques by provision of a dielectric layer 82 over respective storage nodes 76, 78 and provision of a subsequent polysilicon layer 84 thereover. As so formed, capacitors in respective partitioned parts of the area defined by capacitor containers 76 and 78 are separated from immediately adjacent capacitors or have a closest separation distance which is substantially no greater than the width of the partition or spacer 74 between the capacitors.

Figure 19:
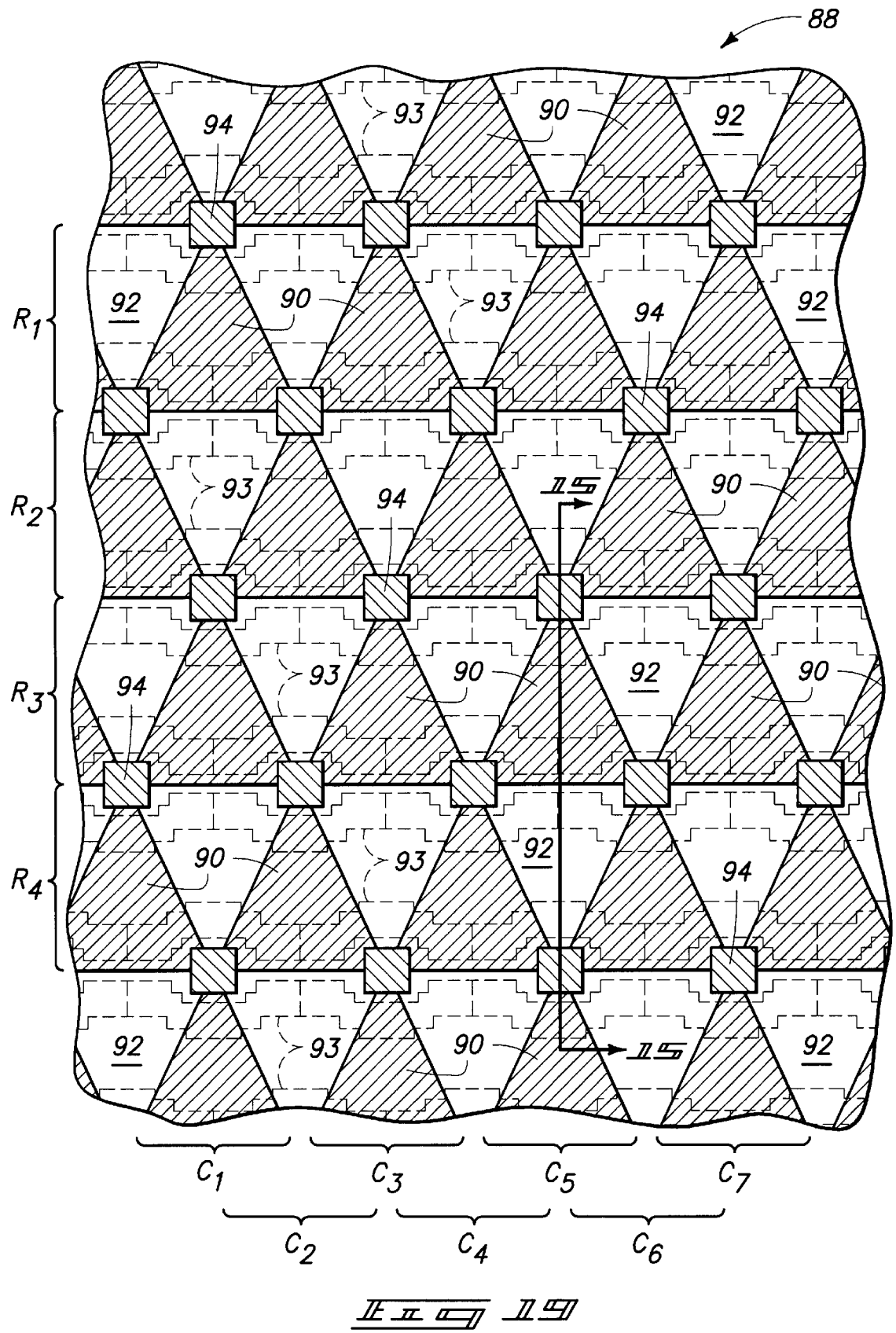
FIG. 19 is a top plan view of a portion of a semiconductor mask layout in accordance with one aspect of the invention.

Referring to FIG. 19, a diagrammatic semiconductor mask layout and DRAM array is designated generally by reference numeral 88. Layout 88 is utilized to enable the above-described containers to be selectively, alternately formed or etched in the two described separate etching steps. For purposes of clarity, FIG. 15 is taken along line 15—15 in FIG. 19 at a processing point just after the etching of openings 76 (FIG. 15) using layout 88. Layout 88 enables capacitors having unique, space-saving geometries to be formed over the substrate. According to one aspect of the invention, the electrically insulative partitions 74 (FIG. 15) are formed between adjacent capacitors intermediate the two etching steps which form or define the areas over the substrate in which the capacitors will be formed. The partitions 74 are not shown for clarity in FIG. 19.

Mask layout 88 includes a plurality of rows such as those illustrated at $R_1$, $R_2$, $R_3$ and $R_4$. The mask layout also includes a plurality of columns such as those illustrated at $C_1$, $C_2$, $C_3$, $C_4$, $C_5$, $C_6$ and $C_7$. A plurality of masked areas 90 and a plurality of adjacent unmasked areas 92 are defined by the layout. Unmasked areas 92 correspond to capacitor container opening patterns 76 in FIG. 15 and masked areas 90 correspond to photoresist. Layout 88 enables a plurality of capacitors to be formed, which may be as part of a DRAM array over the substrate, wherein respective alternate capacitors in a row, such as rows $R_1$–$R_4$, have substantially similar lateral width profiles transverse the row. In one embodiment, respective adjacent capacitors in a row have different lateral width profiles transverse the row. The illustrated lateral width profiles when viewed from a point above the substrate approximate triangles which are oriented in a top-to-bottom fashion across the row. Additionally, individual defined areas in which the capacitor pairs are to be formed (corresponding to the view taken along line 15—15 in column $C_5$) approximate a diamond shape with such shape having at its respective corners, bit line contacts 94 which are formed as described above. For purposes of the ongoing discussion, each of columns $C_1$–$C_7$ are formed along a generally straight line which is generally transverse each of rows $R_1$–$R_4$. Further, the array of capacitor pairs to be formed are formed along individual lines which contain at least one of the pairs of capacitors. As such, the array is defined by a plurality of the lines (corresponding to the plurality of the columns) which contain a plurality of capacitors which are separated by substantially no more than an electrically insulative anisotropically etched spacer 74 as described above. Underlying word lines are shown by dashed lines 93 and interconnect associated transistors formed relative to the substrate. Individual bit lines are not specifically shown but are subsequently formed and oriented generally transversely relative to the word lines 93.

It has been discovered that two different effects can distort relative sizes of the first, dry etched capacitor containers 76 relative to the second, wet etched capacitor containers 78. A first of these effects is that the wet clean following the dry etch used to form the dry etched containers may also enlarge the first capacitor containers 76, in part by tending to make the first capacitor containers 76 more rounded. This tends to cause the first capacitor containers 76 to be enlarged relative to the second capacitor containers 78. The first effect tends to be exacerbated by need to wet etch to remove any remaining BPSG from sides of the bit line contacts 72. A second of these effects is that, especially for very small first and second capacitor containers 76 and 78, exposure of positive photoresist tends to result in curvature or rounding of edges of the photoresist patterns 90, which also tends to enlarge the first capacitor containers 76 relative to the second capacitor containers 78.

It has been further discovered that these effects may be ameliorated by using a negative resist to form the photoresist patterns 90. Use of a negative resist tends to reverse the direction of curvature of the edges of the photoresist patterns 90. In turn, this allows a longer wet etch in order to ensure complete removal of any BPSG remaining on sides of the bit line contacts 72. As a result, pattern distortions originating in the photolithography process used to define the photoresist patterns 90 tend to cancel out pattern distortions of the first capacitor containers 76 originating in the wet etch process used to define the second capacitor containers 78. In turn, the first and second capacitors containers 76 and 78 tend to be more nearly equal, resultin in improved DRAM operation and in improved operating margins for such DRAMs.

Figure 20:
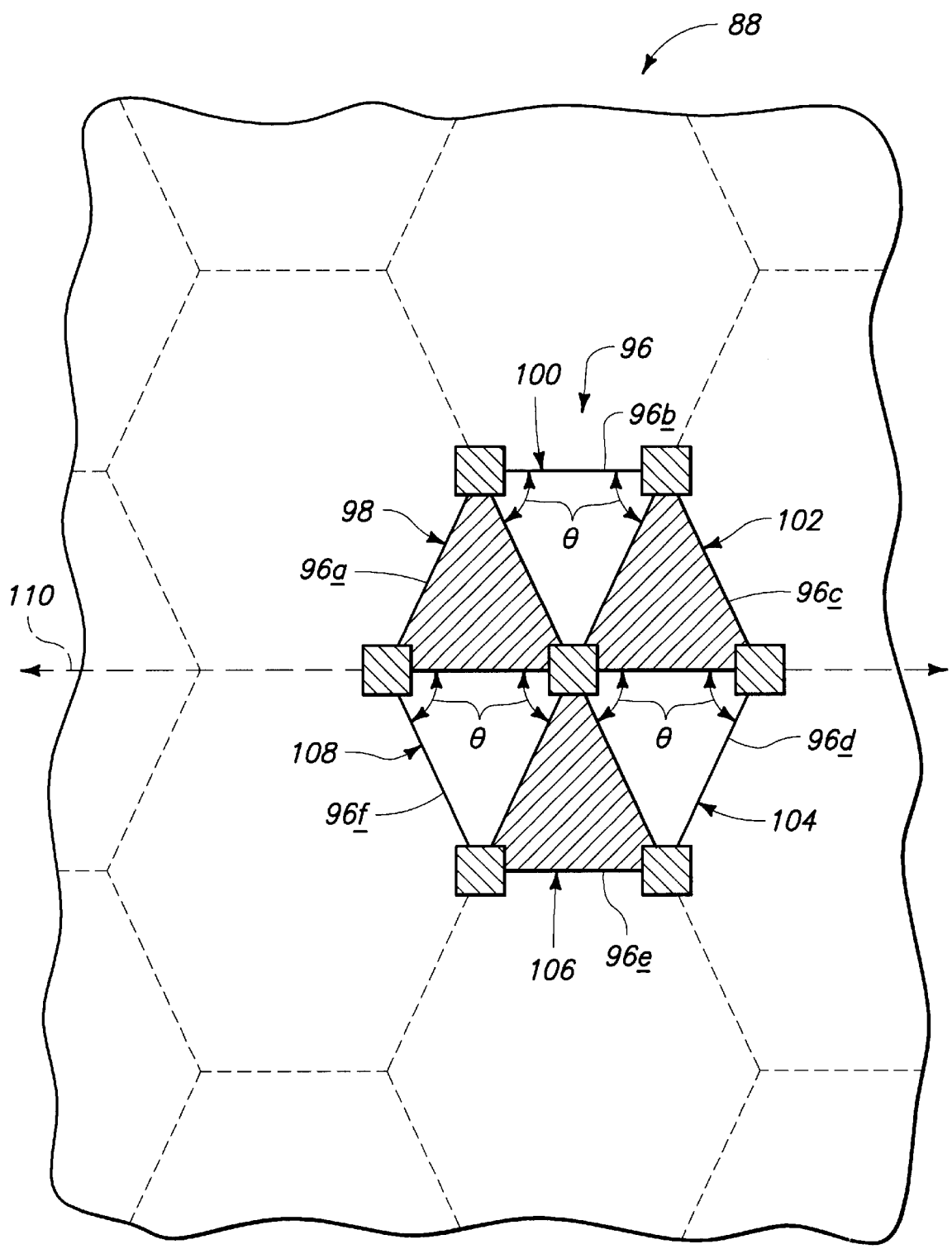
FIG. 20 is a top plan view of the FIG. 19 semiconductor mask layout with a portion highlighted for purposes of discussion.

Referring to FIG. 20, a mask layout 88 defines in part a DRAM array which includes a plurality of six-capacitor geometries which are to be formed over the substrate. A representative of one of the geometries is indicated generally by reference numeral 96 and a plurality of adjacent or other geometries are shown in phantom lines. The illustrated six-capacitor geometries are, in turn, defined by a plurality of individual polygonal capacitor geometries shown collectively at 98 through 108. In one embodiment, collective individual capacitor geometries 98 through 108 approximate a hexagon, individual sides of which are defined by a side of a different respective one of the individual polygonal capacitor geometries. For example, the six-capacitor geometry or hexagon 96 includes six sides collectively shown at 96a, 96b, 96c, 96d, 96e and 96f. Each of such sides is defined by a different respective one of the individual sides of the individual polygonal capacitor geometries 98 through 108. According to one embodiment of the invention, the individual polygonal capacitor geometries 98 through 108, when viewed outwardly of the substrate, approximate a wedge or wedge-shape. In one embodiment, such individual geometries approximate a triangle which may be an isosceles triangle. In one embodiment, individual approximated isosceles triangles include equal adjacent angles θ which approximate a range of between about 50° to 70°. Such equal adjacent angles are shown for the individual geometries 100, 104 and 108. In one embodiment, such equal adjacent angles approximate an angle of about 65°. The individual geometries 98 through 102 and 104 through 108, respectively, may be arranged in a top-to-bottom orientation such that the hexagon 96 can be bisected, as shown by dashed line 110, into halves containing exactly three individual polygonal capacitor geometries. In the illustrated hexagon, one of the halves, a top half as viewed in FIG. 20, contains the individual geometries 98, 100 and 102. The other of the halves, a bottom half, contains the geometries 104, 106 and 108.

Figure 21:
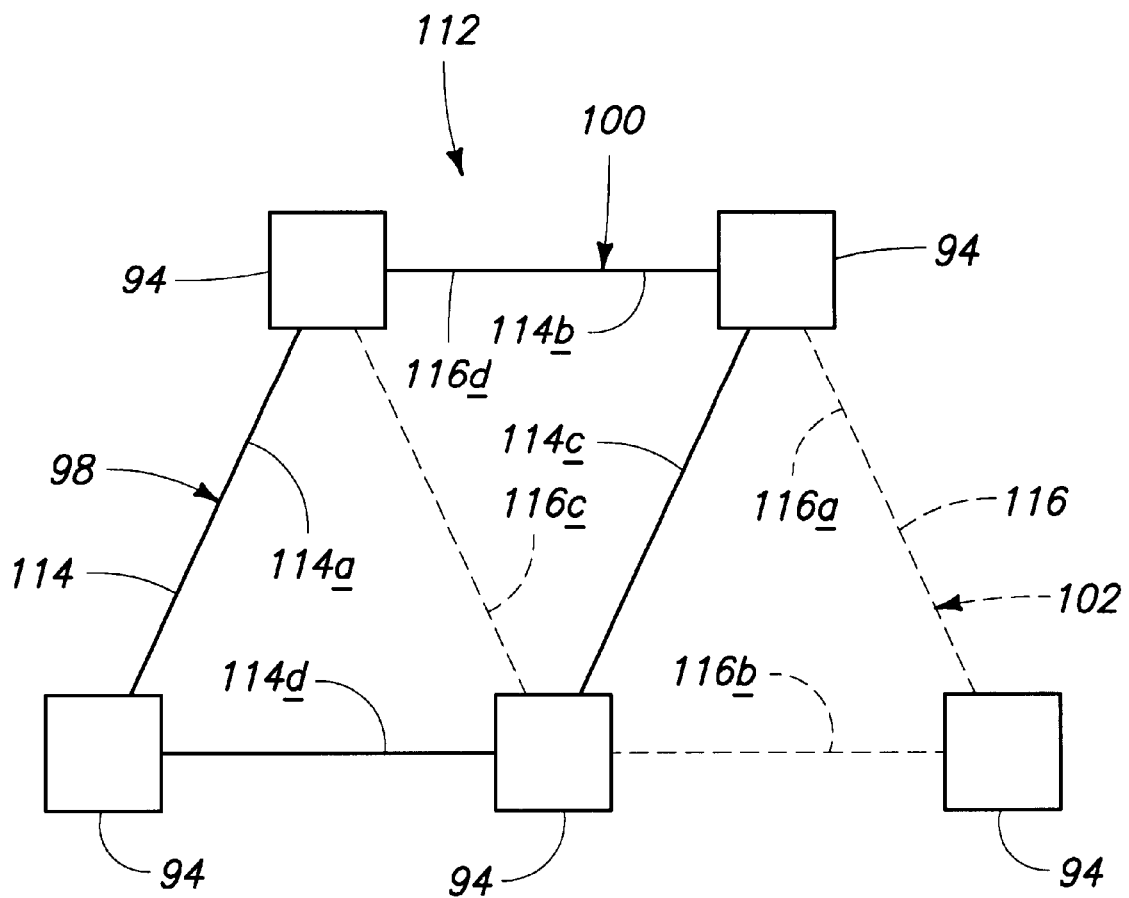
FIG. 21 is a view of a portion of the FIG. 20 semiconductor mask layout highlighted portion.

Referring to FIG. 21, the top half containing the geometries 98, 100 and 102 is shown, comprising a three-capacitor geometry 112. A plurality of three-capacitor geometries 112 are disposed over the substrate. In one embodiment, the three-capacitor geometry 112, when viewed outwardly of the substrate, defines a pair of overlapping approximated parallelograms, the intersection of which approximates a triangle. A first of such parallelograms is shown at 114. A second of such parallelograms is shown at 116. The parallelogram 114 includes sides 114a, 114b, 114c and 114d. The parallelogram 116 includes sides 116a, 116b, 116c and 116d. The parallelograms share sides 114b and 116d. As shown, each approximated parallelogram is bounded at a respective one of its corners by a bit line contact 94. The approximated triangle defined by the intersection of the parallelograms 114, 116 includes sides 114c, 116c and shared an sides 114b/116d. For purposes of ongoing discussion, a plurality of capacitor pairs are selectively and alternately etched over the substrate along etch axes which are generally orthogonal relative to the substrate and into the plane of the page upon which FIG. 21 appears. Such capacitor pairs can approximate the above described parallelogram and would include the individual capacitors etched as a result of individual geometries 98, 100, or alternatively 100, 102.

Referring to both FIGS. 16 and 19, a DRAM array is formed atop a substrate and includes a first set of capacitors formed in first set of capacitor containers 76 over the substrate. A second set of capacitors are formed over the substrate and in second set capacitor containers 78. Individual capacitors of the first set are bounded by at least three capacitors from the second set (FIG. 19). In one embodiment, individual first set capacitors have a closest separation distance from at least one of the three bounding capacitors which is substantially no more than a width of an electrically insulative anisotropically etched spacer 74 (FIG. 16). In one embodiment, individual bounded first set capacitors have closest separation distances from no less than two and possibly three of the bounding capacitors which are no more than the width of an electrically insulative anisotropically etched spacer formed or provided between the respective capacitors.

The above described semiconductor device forming methods and integrated circuitry formed thereby constitute an improvement which relates to device spacing over a substrate. Such improvement enables device pitch to be reduced by almost fifty percent or more which represents a substantial space savings over heretofore available methods and devices.

In compliance with the statute, the invention has been described in language more or less specific as to structural and methodical features. It is to be understood, however, that the invention is not limited to the specific features shown and described, since the means herein disclosed comprise forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor memory device comprising:

forming second sidewall spacers comprising a first dielectric material within each of a plurality of openings over a substrate;

narrowing the openings by covering interiors of the second sidewall spacers with a second dielectric material that is different from the first dielectric material;

filling the openings with conductive material to form a contact in electrical communication with a node on the substrate;

selectively removing substrate material to define a first set of containers having first container sidewalls;

forming first sidewall spacers adjacent the first container sidewalls; and selectively removing remaining substrate material adjacent the first sidewall spacers to define a second set of containers.

2. The method of claim 1, further comprising forming capacitors in the containers separated only by the spacers.

3. The method of claim 1, further comprising:

forming a first capacitor plate in each of the first and second containers, the first capacitor plate comprising hemispherical polysilicon in electrical communication with a respective node within respective containers of the first and second containers, respective first capacitor plates being insulated from one another by the first sidewall spacers;

forming a dielectric layer covering each respective first capacitor plate; and forming a second capacitor plate on the dielectric layer.

4. The method of claim 1, wherein filling the openings with conductive material comprises filling the openings with conductive polysilicon.

5. The method of claim 1, wherein forming second sidewall spacers within each of the openings comprises:

depositing a dielectric layer comprising silicon nitride to form the first dielectric material; and anisotropically etching the dielectric layer to expose the node.

6. The method of claim 1, wherein narrowing the openings comprises:

depositing a layer of the second dielectric material comprising silicon dioxide; and anisotropically etching the layer of second dielectric material to expose the node.

7. The method of claim 1, wherein selectively removing substrate material to define a first set of containers having first container sidewalls comprises:

plasma etching the substrate material to form a first set of containers;

forming a dielectric layer in the first set of containers; and anisotropically etching the dielectric layer to form sidewalls in the first set of containers.

8. The method of claim 1, wherein selectively removing remaining substrate material adjacent the spacers to define a second set of containers comprises wet etching the remaining substrate material selectively with respect to the first and second sidewall spacers.

9. The method of claim 1, wherein forming an opening comprises forming a bit line contact opening.

10. A method of forming a semiconductor memory device comprising:
    forming a plurality of openings over a substrate, individual openings having at least one sidewall;
    covering the at least one sidewall of the plurality of openings with a first insulating material;
    etching the first insulating material to form second sidewall spacers;
    narrowing the openings by covering interiors of the second sidewall spacers with a second insulating material that is different from the first insulating material;
    forming electrically conductive material in the openings to provide contacts;
    defining a first set of containers having container sidewalls, wherein defining the first set of containers includes selectively etching the first set of containers relative to the sidewall spacers and the electrically conductive material of the contacts;
    forming first sidewall spacers adjacent the container sidewalls; and
    defining a second set of containers, respective ones of the second set of containers adjacent respective containers of the first set of containers.

11. The method of claim 10, further comprising forming capacitors in the containers separated only by the spacers.

12. The method of claim 10, further comprising:
    forming a first capacitor plate in each of the first and second containers, the first capacitor plate comprising hemispherical polysilicon in electrical communication with a respective node within respective containers of the first and second containers, respective first capacitor plates being insulated from one another by the first sidewall spacers;
    forming a dielectric layer covering each respective first capacitor plate; and
    forming a second capacitor plate on the dielectric layer.

13. The method of claim 10, wherein forming electrically conductive material in the openings comprises filling the openings with conductive polysilicon.

14. The method of claim 10, wherein forming second sidewall spacers within each of the openings comprises:
    depositing a dielectric layer comprising silicon nitride to form the first insulating material; and
    anisotropically etching the dielectric layer to expose the node.

15. The method of claim 10, wherein narrowing the openings comprises:
    depositing a layer of the second insulating material comprising silicon dioxide; and
    anisotropically etching the layer of second insulating material to expose the node.

16. The method of claim 10, wherein defining a first set of containers having first container sidewalls comprises:
    plasma etching the substrate material to form a first set of containers;
    forming a dielectric layer in the first set of containers; and
    anisotropically etching the dielectric layer to form sidewalls in the first set of containers.

17. The method of claim 10, wherein defining a second set of containers comprises wet etching substrate material selectively with respect to the first and second sidewall spacers.

18. The method of claim 10, wherein forming a plurality of openings over a substrate includes forming a plurality of bit line contact openings over a substrate.

19. The method of claim 10, wherein:
    defining the first set of containers comprises selectively removing substrate material to define the first set of containers, wherein defining the first set of containers includes selectively etching the first set of containers relative to the sidewall spacers and the electrically conductive material of the contacts; and
    defining the second set of containers comprises selectively removing remaining substrate material adjacent the first sidewall spacers to define the second set of containers.

20. A method of forming a semiconductor memory device comprising:
    forming a plurality of openings over a substrate;
    forming second sidewall spacers comprising a first dielectric material within each of the openings;
    filling the openings with conductive material to form a contact in electrical communication with a node on the substrate;
    etching substrate material through a first set of openings to define a first set of containers having first container sidewalls;
    forming first sidewall spacers adjacent the first container sidewalls; and
    selectively removing remaining substrate material adjacent the first sidewall spacers to define a second set of containers.

21. The method of claim 20, further comprising:
    narrowing the openings by covering interiors of the second sidewall spacers with a second dielectric material that is different from the first dielectric material prior to filling the openings; and
    forming capacitors in the containers separated only by the spacers.

22. The method of claim 20, further comprising:
    forming a first capacitor plate in each of the first and second containers, the first capacitor plate comprising hemispherical polysilicon in electrical communication with a respective node within respective containers of the first and second containers, respective first capacitor plates being insulated from one another by the first sidewall spacers;
    forming a dielectric layer covering each respective first capacitor plate; and
    forming a second capacitor plate on the dielectric layer.

23. The method of claim 20, wherein filling the openings with conductive material comprises filling the openings with conductive polysilicon.

24. The method of claim 20, wherein forming second sidewall spacers within each of the openings comprises:
    depositing a dielectric layer comprising silicon nitride to form the first dielectric material; and
    anisotropically etching the dielectric layer to expose the node.

25. The method of claim 20, wherein narrowing the openings comprises:
    depositing a layer of the second dielectric material comprising silicon dioxide; and anisotropically etching the layer of second dielectric material to expose the node.

26. The method of claim 20, wherein selectively removing substrate material to define a first set of containers having first container sidewalls comprises:

plasma etching the substrate material to form a first set of containers;

forming a dielectric layer in the first set of containers; and anisotropically etching the dielectric layer to form sidewalls in the first set of containers.

27. The method of claim 20, wherein selectively removing remaining substrate material adjacent the spacers to define a second set of containers comprises wet etching the remaining substrate material selectively with respect to the first and second sidewall spacers.

28. The method of claim 20, wherein forming an opening comprises forming a bit line contact opening.

29. The method of claim 20, further comprising forming a negative photoresist mask to define the first set of openings.

30. A method of forming a semiconductor memory device comprising:

forming a sacrificial layer comprising borophosphosilicate glass over a substrate;

forming a plurality of openings in the sacrificial layer;

forming second sidewall spacers comprising a first dielectric material within each of the plurality of openings;

narrowing the openings by covering interiors of the second sidewall spacers with a second dielectric material that is different from the first dielectric material;

filling the openings with conductive material to form a contact in electrical communication with a node on the substrate;

selectively removing substrate material to define a first set of containers having first container sidewalls;

forming first sidewall spacers adjacent the first container sidewalls; and selectively removing remaining substrate material adjacent the first sidewall spacers to define a second set of containers.

31. The method of claim 30, further comprising forming capacitors in the containers separated only by the spacers.

32. The method of claim 30, further comprising:

forming a first capacitor plate in each of the first and second containers, the first capacitor plate comprising hemispherical polysilicon in electrical communication with a respective node within respective containers of the first and second containers, respective first capacitor plates being insulated from one another by the first sidewall spacers;

forming a dielectric layer covering each respective first capacitor plate; and forming a second capacitor plate on the dielectric layer.

* * * * *

UNITED STATES PATENT AND TRADEMARK OFFICE
CERTIFICATE OF CORRECTION

PATENT NO. : 6,593,203 B2
DATED : July 15, 2003
INVENTOR(S) : Werner Juengling

It is certified that error appears in the above-identified patent and that said Letters Patent is hereby corrected as shown below:

<u>Title page,</u>
Item [57], ABSTRACT,
Line 11, delete "a".

<u>Column 5,</u>
Line 43, replace "not may" with -- may not --.

<u>Column 8,</u>
Line 46, replace "resultin" with -- resulting --.

<u>Column 9,</u>
Line 35, delete "an".

Signed and Sealed this

Thirtieth Day of September, 2003

JAMES E. ROGAN
*Director of the United States Patent and Trademark Office*